(12) United States Patent
Salahuddin et al.

(10) Patent No.: US 10,964,468 B2
(45) Date of Patent: Mar. 30, 2021

(54) MAGNETIC MEMORY STRUCTURES USING ELECTRIC-FIELD CONTROLLED INTERLAYER EXCHANGE COUPLING (IEC) FOR MAGNETIZATION SWITCHING

(71) Applicant: The Regents of the University of California, Oakland, CA (US)

(72) Inventors: Sayeef Salahuddin, Walnut Creek, CA (US); Shehrin Sayed, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/510,343

(22) Filed: Jul. 12, 2019

(65) Prior Publication Data

US 2021/0012940 A1    Jan. 14, 2021

(51) Int. Cl.
*G11C 11/16* (2006.01)
*H01F 10/32* (2006.01)
*H01L 43/02* (2006.01)
*H01L 43/10* (2006.01)

(52) U.S. Cl.
CPC .......... *H01F 10/329* (2013.01); *G11C 11/161* (2013.01); *G11C 11/1675* (2013.01); *H01F 10/3259* (2013.01); *H01F 10/3286* (2013.01); *H01L 43/02* (2013.01); *H01L 43/10* (2013.01)

(58) Field of Classification Search
CPC ............... H01F 10/329; H01F 10/3286; H01F 10/3259; G11C 11/1675; G11C 11/161; H01L 43/10; H01L 43/02
See application file for complete search history.

(56) References Cited

U.S. PATENT DOCUMENTS

| 2011/0062538 A1* | 3/2011 | Rizzo ..................... G11C 11/161 |
| | | 257/421 |
| 2018/0166197 A1* | 6/2018 | Wang ...................... G11C 11/18 |
| 2018/0240966 A1* | 8/2018 | Mihajlovic ............. H01L 43/08 |

OTHER PUBLICATIONS

Datta, D. et al., "Voltage Asymmetry of Spin-Transfer Torques," IEEE Transactions on Nanotechnology, vol. 11, No. 2, Mar. 2012, pp. 261-272.

(Continued)

*Primary Examiner* — Gene N Auduong
(74) *Attorney, Agent, or Firm* — Withrow & Terranova, P.L.L.C.

(57) ABSTRACT

A magnetic memory structure employs electric-field controlled interlayer exchange coupling between a free magnetic layer and a fixed magnetic layer to switch a magnetization direction. The magnetic layers are separated by a spacer layer disposed between two oxide layers. The spacer layer exhibits a large IEC while the oxide layers provide tunnel barriers, forming a quantum-well between the magnetic layers with discrete energy states above the equilibrium Fermi level. When an electric field is applied across the structure, the tunnel barriers become transparent at discrete energy states via a resonant tunneling phenomenon. The wave functions of the two magnets then can interact and interfere to provide a sizable IEC. IEC can control the magnetization direction of the free magnetic layer relative to the magnetization direction of the fixed magnetic layer depending on the sign of the IEC, induced by a magnitude of the applied electric field above a threshold value.

26 Claims, 9 Drawing Sheets

(56) References Cited

OTHER PUBLICATIONS

Sayed, S. et al., "Rectification in Spin-Orbit Materials Using Low-Energy-Barrier Magnets," Physical Review Applied, vol. 11, 2019, American Physical Society, 10 pages.
Apalkov, D. et al., "Magnetoresistive Random Access Memory," Proceedings of the IEEE, vol. 104, No. 10, Oct. 2016, IEEE, pp. 1796-1830.
Bauer, U. et al., "Magneto-ionic control of interfacial magnetism," Nature Materials, vol. 14, Feb. 2015, pp. 174-181.
Bennett, W.R. et al., "Concurrent Enhancement of Kerr Rotation and Antiferromagnetic Coupling in Epitaxial Fe/Cu/Fe Structures," Physical Review Letters, vol. 65, No. 25, Dec. 17, 1990, pp. 3169-3172.
Berger, L., "Emission of spin waves by a magnetic multilayer traversed by a current," Physical Review B, vol. 54, No. 13, Oct. 1, 1996, 6 pages.
Bhowmik, D. et al., "Possible Route to Low Current, High Speed, Dynamic Switching in a Perpendicular Anisotropy CoFeB—MgO Junction Using Spin Hall Effect of Ta," 2012 International Electron Devices Meeting, Dec. 10-13, 2012, San Francisco, CA, IEEE, 4 pages.
Bi, C. et al., "Reversible Control of Co Magnetism by Voltage-Induced Oxidation," Physical Review Letters, vol. 113, Dec. 2014, The American Physical Society, 5 pages.
Brookes, N.B. et al., "Magnetic Interface States and Finite-Size Effects," Physical Review Letters, vol. 67, No. 3, Jul. 15, 1991, pp. 354-357.
Brubaker, M. et al., "Oscillatory interlayer magnetic coupling of sputtered Fe/Mo superlattices," Applied Physics Letters, vol. 58, No. 20, May 20, 1991, American Institute of Physics, pp. 2306-2308.
Bruno, P. et al., "Theory of interlayer magnetic coupling," Physical Review B, vol. 52, No. 1, Jul. 1995, The American Physical Society, 30 pages.
Camsari, K. Y. et al., "Ultrafast Spin-Transfer-Torque Switching of Synthetic Ferrimagnets," IEEE Magnetics Letters, vol. 7, 2016, IEEE, 5 pages.
Chang, L.L. et al., "Resonant tunneling in semiconductor double barriers," Applied Physics Letters, vol. 24, 2003, AIP Publishing, 4 pages.
Chappert, C. et al., "The emergence of spin electronics in data storage," Nature Materials, vol. 6, Nov. 2007, Nature Publishing Group, pp. 813-823.
Chatterjee, J. et al., "Novel multifunctional RKKY coupling layer for ultrathin perpendicular synthetic antiferromagnet," Scientific Reports, vol. 8, 2018, 9 pages.
Cherifi, R.O. et al., "Electric-field control of magnetic order above room temperature," Nature Materials, vol. 13, Apr. 2014, Macmillan Publishers Limited, pp. 345-351.
Chiang, Y.F. et al., "Oxidation-induced biquadratic coupling in Co/Fe/MgO/Fe(001)," Physical Review B, vol. 79, 2009, The American Physical Society, 5 pages.
Datta, S., "Electronic Transport in Mesoscopic Systems," Cambridge University Press, 1995, 393 pages.
Dinia, A. et al., "Interfacial polarisation effect on the interlayer couplings in Co/Rh sandwiches," The European Physical Journal B, vol. 5, 1998, Springer-Verlag, 12 pages.
Faure-Vincent, J. et al., "Interlayer Magnetic Coupling Interactions of Two Ferromagnetic Layers by Spin Polarized Tunneling," Physical Review Letters, vol. 89, No. 10, Sep. 2, 2002, The American Physical Society, 4 pages.
Fullerton, E. et al., "Oscillatory interlayer coupling and giant magnetoresistance in epitaxial Fe/Cr(2&g) and (100) superlattices," Physical Review B, vol. 48, No. 21, Dec. 1, 1993, The American Physical Society, pp. 15755-15763.
Haney, P. et al., "Bias dependence of magnetic exchange interactions: Application to interlayer exchange coupling in spin valves," Physical Review B, vol. 79, 2009, 9 pages.

Heron, J.T. et al., "Deterministic switching of ferromagnetism at room temperature using an electric field," Nature, vol. 516, Dec. 2014, Macmillan Publishers Limited, 15 pages.
Kawahara, T. et al., "Spin-transfer torque RAM technology: Review and prospect," Microelectronics Reliability, vol. 52, 2012, Elsevier Ltd., pp. 613-627.
Li, X.-X. et al., "Oscillatory antiferromagnetic interlayer coupling in Co/Pt multilayer withperpendicular anisotropy," Solid State Communications, vol. 148, 2008, Elsevier Ltd., pp. 209-212.
Liu, R.S. et al., "CoFe alloy as middle layer for strong spin dependent quantum well resonant tunneling in MgO double barrier magnetic tunnel junctions," Physical Review B, vol. 87, 2013, American Physical Society, 5 pages.
Liu, Z.Y. et al., "Oscillatory Interlayer Exchange Coupling and Its Temperature Dependence in [Pt/Co]3/NiO/[Co/Pt]3 Multilayers with Perpendicular Anisotropy," Physical Review Letters, vol. 91, No. 3, Jul. 18, 2003, The American Physical Society, 4 pages.
Marrazzo, A. et al., "Locality of the anomalous Hall conductivity," Physical Review B, vol. 95, No. 12, 2017, American Physical Society, 4 pages.
Mathon, J. et al., "Theory of oscillatory exchange in magnetic multilayers:effect of partial confinement and band mismatch," Journal of Magnetism and Magnetic Materials, vol. 121, 1993, Elsevier Science Publishers B.V., pp. 242-247.
Matsukura, F. et al., "Control of magnetism by electric fields," Nature Nanotechnology, vol. 10, Mar. 2015, MacMillan Publishers Limited, pp. 209-220.
Newhouse-Illige, T. et al., "Voltage-controlled interlayer coupling in perpendicularly magnetized magnetic tunnel functions," Nature Communications, vol. 8, Article 15232, May 2017, 7 pages.
Ortega, J.E. et al., "Quantum-well states and magnetic coupling between ferromagnets through a noble-metal layer," Physical Review B, vol. 47, No. 3, Jan. 15, 1993, The American Physical Society, 14 pages.
Parkin, S.S.P., "Systematic Variation of the Strength and Oscillation Period of Indirect Magnetic Exchange Coupling through the 3d, 4d, and 5d Transition Metals," Physical Review Letters, vol. 67, No. 25, Dec. 16, 1991, The American Physical Society, 4 pages.
Petroff, F. et al., "Oscillatory interlayer exchange and magnetoresistance in Fe/Cu multilayers," Physical Review B, vol. 44, No. 10, Sep. 1, 1991, The American Physical Society, pp. 5355-5357.
Salahuddin, S. et al., "The era of hyper-scaling in electronics," Nature Electronics, vol. 1, Aug. 2018, pp. 442-450.
Schleicher, F. et al., "Localized states in advanced dielectrics from the vantage of spin- and symmetry-polarized tunnelling across MgO," Nature Communications, vol. 5, 2014, Macmillan Publishers Limited, 9 pages.
Slonczewski, J.C., "Conductance and exchange coupling of two ferromagnets separated by a tunneling barrier," Physical Review B, vol. 39, No. 10, Apr. 1, 1989, The American Physical Society, pp. 6995-7002.
Slonczewski, J.C., "Letter to the Editor: Current-driven excitation of magnetic multilayers," Journal of Magnetism and Magnetic Materials, vol. 159, 1996, Elsevier, 7 pages.
Song, C. et al., "Recent progress in voltage control of magnetism: Materials,mechanisms, and performance," Progress in Materials Science, vol. 87, 2017, Elsevier Ltd., pp. 33-82.
Sun, J.Z., "Spin-current interaction with a monodomain magnetic body: A model study," Physical Review B, vol. 62, No. 1, Jul. 1, 2000, 9 pages.
Suzuki, R. et al., "Quantum size effect in an Fe quantum well detected by resonant tunneling carriers injected from a p-type Ge semiconductor electrode," Applied Physics Letters, vol. 112, 2018, AIP Publishing, 6 pages.
Tang, Y.-H. et al, Controlling the Nonequilibrium Interlayer Exchange Coupling in Asymmetric Magnetic Tunnel Junctions, Physical Review Letters, vol. 103, 2009, The American Physical Society, 4 pages.
Tao, B.S. et al., "Long-Range Phase Coherence in Double-Barrier Magnetic Tunnel Junctions with a Large Thick Metallic Quantum Well," Physical Review Letters, vol. 115, 2015, American Physical Society, 6 pages.

(56) References Cited

OTHER PUBLICATIONS

Toscano, S. et al., "Exchange-coupling between ferromagnets through a non-metallic amorphous spacer-layer," Journal of Magnetism and Magnetic Materials, vol. 114, 1992, Elsevier Science Publishers B.V., 5 pages.

Victora, R.H., "Composite Media for Perpendicular Magnetic Recording," IEEE Transactions on Magnetics, vol. 41, No. 2, Feb. 2005, IEEE, pp. 537-542.

Wang, L. et al., "Voltage-Controlled Magnetic Tunnel Junctions for Processing-In-Memory Implementation," IEEE Electron Device Letters, vol. 39, No. 3, Mar. 2018, IEEE, 4 pages.

Yakushiji, K. et al., "Very strong antiferromagnetic interlayer exchange coupling with iridium spacer layer for perpendicular magnetic tunnel junctions," Applied Physics Letters, vol. 110, 2017, API Publishing, 5 pages.

Yang, H.X. et al., "Effect of structural relaxation and oxidation conditions on interlayer exchange coupling in Fe|MgO|Fe tunnel junctions," Applied Physics Letters, vol. 96, 2010, AIP Publishing, 4 pages.

Yoda, H., "26: MRAM Fundamentals and Devices," Handbook of Spintronics, 2016, Springer Science+Business Media, pp. 1031-1064.

You, C.-Y. et al., "Prediction of switching/rotation of the magnetization direction with applied voltage in a controllable interlayer exchange coupled system," Journal of Magnetism and Magnetic Materials, vol. 195, 1999, Elsevier, pp. 488-500.

You, C.-Y. et al., "Tunable interlayer exchange coupling energy by modification of Schottkybarrier potentials," Journal of Magnetism and Magnetic Materials, vol. 293, 2005, Elsevier B.V., pp. 774-781.

Yuasa, S. et al., "Giant room-temperature magnetoresistance in single-crystal Fe/MgO/Fe magnetic tunnel junctions," Nature Materials, vol. 3, Dec. 2004, Nature Publishing Group, pp. 868-871.

\* cited by examiner

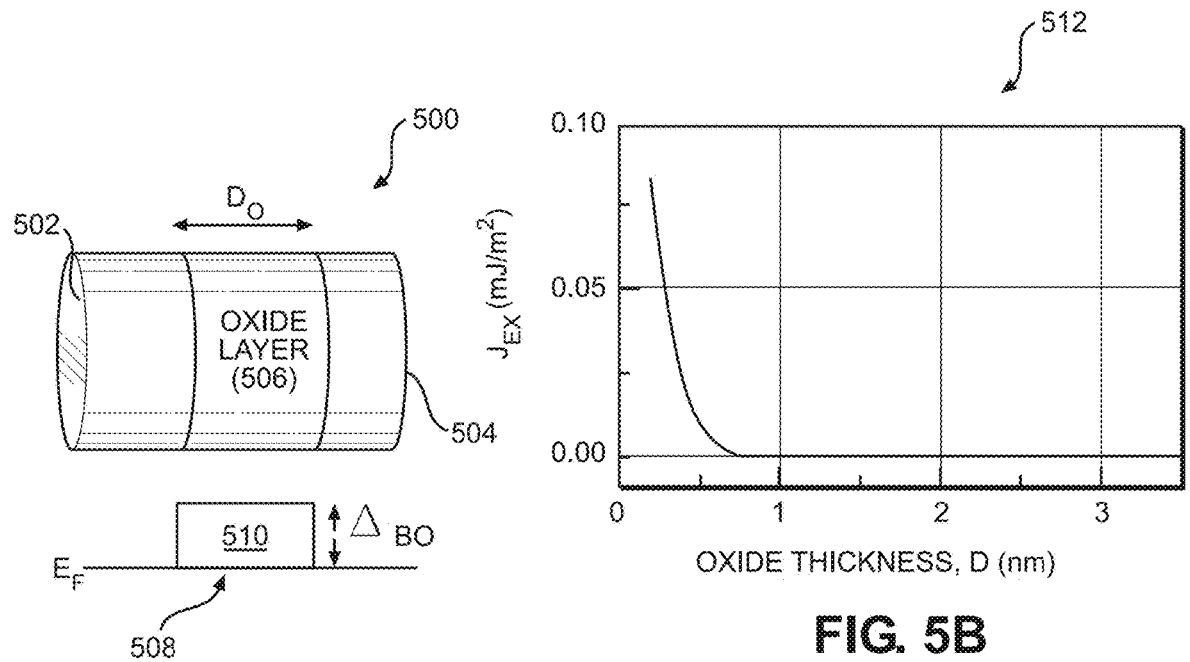
FIG. 5A
FIG. 5B
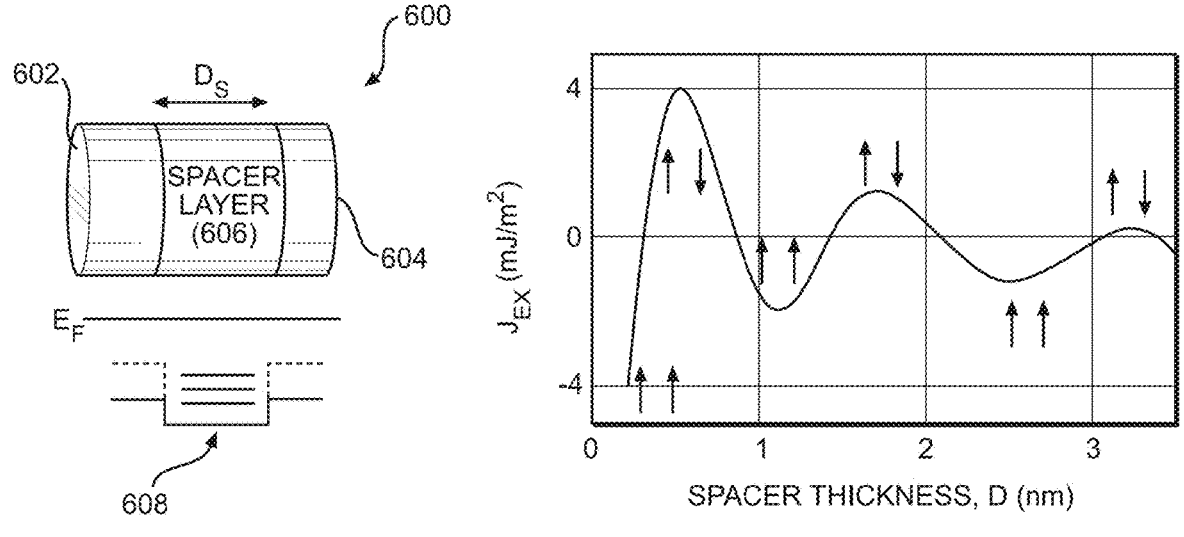
FIG. 6A
FIG. 6B

STT SWITCHING (i) SWITCHING THRESHOLD SPIN CURRENT DENSITY:

$$J_{STT0} = \frac{1}{S} 2E_2 \alpha_g \left(1 + n \frac{2\pi M_{s2}}{H_{k2}}\right) \quad \text{UNIT: JOULE PER SQUARE METER}$$

(ii) SWITCHING SPEED:

$$\tau_{s0} = \frac{\ln\left(\frac{\pi}{2}\right) - \ln \theta_0}{\alpha_g \gamma (H_{k2} + n2\pi M_{s2})} \left(\frac{1}{\frac{J_{STT}}{J_{STT0}} - 1}\right)$$

FIG. 9

IEC SWITCHING (i) SWITCHING THRESHOLD IEC ENERGY:

$$J_{IEC0} = \frac{1}{S} \frac{E_1 E_2}{E_1 + E_2} \quad \text{UNIT: JOULE PER SQUARE METER}$$

(ii) SWITCHING SPEED:

$$\tau_{IEC} = \frac{8\sqrt{\pi}}{\alpha_g \gamma (H_{k2} + n2\pi M_{s2})} \frac{|J_{IEC0}|}{|J_{IEC}|} \left(\frac{\pi}{2} - \theta_0\right)$$

FIG. 10

MAGNETIC MEMORY STRUCTURES USING ELECTRIC-FIELD CONTROLLED INTERLAYER EXCHANGE COUPLING (IEC) FOR MAGNETIZATION SWITCHING

GOVERNMENT SUPPORT

This invention was made with government funds under Agreement No. HR0011-18-3-0004 awarded by The Defense Advanced Research Projects Agency (DARPA). The U.S. Government has certain rights in this invention.

FIELD OF THE DISCLOSURE

The technology of the disclosure relates generally to electronic data storage and, more particularly, to data storage in a magnetic memory structure.

BACKGROUND

Many different technologies are used to create electronic data storage ("memory") elements for storing programs and data in binary form in electronic devices. Memory element technologies are characterized by their access times (i.e., read and write delay), density, power utilization, and volatility in the absence of power. Technologies that excel in one or more of these characteristics are typically inferior in other respects. As a result, different memory element technologies are used for different purposes, according to their particular characteristics. FIG. 1 is a graph 100 which compares read/write speed and density of various electronic data storage technologies. As shown in FIG. 1, static random access memory (RAM) (SRAM) technology can have a very fast read/write speed, which is beneficial for use with a high-speed processor, but the high speed is obtained at the expense of a large area needed for the multiple transistors of which each SRAM cell is comprised, as well as the other components of an SRAM array. Dynamic RAM (DRAM) is more dense, but not as fast as high-speed SRAM. Unfortunately, both SRAM and DRAM elements are volatile, meaning that the data stored therein is lost when power is removed. In contrast, a high-density non-volatile memory (NVM) such as NAND FLASH has been developed for long-term storage, but the long access time of NVM storage is too slow for use in high-speed processor applications. Field-written magnetic RAM (MRAM) is an example of memory that can have a much faster read/write speed (i.e., short access latency) than NAND FLASH, but is non-volatile, so no power is required to preserve the data stored therein.

Data is stored in an MRAM by controlling a direction of magnetization in a free magnetic layer in a magnetic structure. A binary bit is stored as one of two magnetization directions. FIG. 2 is a graph 200 comparing energy consumption and access latency of existing MRAM technologies based on spin-transfer torque (STT), spin-orbit torque (SOT), and STT with voltage controlled magnetism (VCM) to those of SRAM. Although MRAM is non-volatile, the access latencies and energy consumption levels of the MRAM technologies are orders of magnitude higher than those of SRAM. Existing MRAM technologies require high current density for switching a magnetization direction of the free magnetic layer, causing high power consumption and less bit density than is preferred for mobile devices.

SUMMARY

Aspects disclosed herein include electric-field controlled interlayer exchange coupling (IEC) for magnetization switching. Electronic data stored in a magnetic memory structure can remain stable for a long period of time in the absence of a power source, unlike static random access memory (RAM) (SRAM) and dynamic RAM (DRAM) which lose data when power is removed. Existing magnetic RAM (MRAM) technologies employing current-induced spin-transfer torque (STT) or spin-orbit toque (SOT), however, require a large current density for switching a magnetization direction, which limits advancements in energy efficiency and bit density. A magnetic memory structure disclosed herein makes it possible to employ IEC between a free magnetic layer and a fixed magnetic layer to switch a direction of magnetization in the free magnetic layer under the control of an applied electric field with a significantly lower current density than is required in STT or SOT MRAM devices. The magnetic layers are separated by a composite layer including a spacer layer disposed between two oxide layers. The spacer layer exhibits a large IEC while the oxide layers provide tunnel barriers. The combination of a spacer layer between oxide layers forms a quantum-well (QW) between the magnetic layers with discrete energy states above the equilibrium Fermi level. When an electric field is applied in a direction across the magnetic memory structure, the tunnel barriers become transparent to the wave functions of the magnetic layers at the levels of the discrete energy states via a resonant tunneling phenomenon. This transparency allows the IEC between the fixed magnetic layer and the free magnetic layer to control the magnetization direction of the free magnetic layer to be parallel or antiparallel to the magnetization direction of the fixed magnetic layer depending on the magnitude of the applied electric field in the direction of the electric field. Different magnitudes of an electric field induce different signs (i.e., polarities) of IEC. Here, a positive sign of IEC refers to a switching that will yield an antiparallel alignment, and a negative sign of IEC refers to a switching that will yield a parallel alignment. The IEC can be measured as an energy density in units of Joules per square meter. A magnitude of the IEC required to achieve magnetization switching is defined by a threshold value. The IEC threshold value is independent of a parameter describing a Gilbert damping and a parameter for indicating magnets with in-plane or perpendicular anisotropies, which is not true of existing MRAM technologies. The IEC threshold value can be controlled by selection of materials, cross-sectional area, and thicknesses of the composite layer. However, the switching time of the magnetic memory structure herein can be optimized by the Gilbert damping and depends on whether the magnet has an in-plane or a perpendicular anisotropy, similar to the existing spin-torque based mechanisms.

In this regard, in one aspect, a magnetic memory structure is disclosed. The magnetic memory structure includes a fixed magnetic layer, a free magnetic layer, and a composite layer disposed between the fixed magnetic layer and the free magnetic layer. A magnetization direction of the free magnetic layer relative to a magnetization direction of the fixed magnetic layer is parallel in response to a first input voltage of a polarity between the fixed magnetic layer and the free magnetic layer. The magnetization direction of the free magnetic layer relative to the magnetization direction of the fixed magnetic layer is antiparallel in response to a second input voltage of the polarity between the fixed magnetic layer and the free magnetic layer.

In another aspect, a magnetic memory structure is disclosed. The magnetic memory structure includes a fixed magnetic layer, a free magnetic layer, and a composite layer disposed between the fixed magnetic layer and the free magnetic layer. In the magnetic memory structure, a magnetization direction of the free magnetic layer relative to a magnetization direction of the fixed magnetic layer corresponds to an IEC in the composite layer based on a magnitude of an input voltage between the fixed magnetic layer and the free magnetic layer.

In another aspect, a magnetic memory structure including a fixed magnetic layer, a free magnetic layer, and a composite layer disposed between the fixed magnetic layer and the free magnetic layer is disclosed. The composite layer includes a spacer layer disposed between the fixed magnetic layer and the free magnetic layer, a first oxide layer disposed between the fixed magnetic layer and the spacer layer, and a second oxide layer disposed between the spacer layer and the free magnetic layer. In the magnetic memory structure, a first magnetization direction of the free magnetic layer relative to a magnetization direction of the fixed magnetic layer corresponds to a first magnitude of an input voltage of a polarity between the fixed magnetic layer and the free magnetic layer. A second magnetization direction of the free magnetic layer relative to the magnetization direction of the fixed magnetic layer corresponds to a second magnitude of the input voltage of the polarity between the fixed magnetic layer and the free magnetic layer. The first magnitude of the input voltage and the second magnitude of the input voltage depend on a thickness of the spacer layer.

In another aspect, a method of storing data in a magnetic memory structure is disclosed. The method includes supplying a first input voltage of a polarity between a fixed magnetic layer and a free magnetic layer separated by a composite layer to control a magnetization direction of the free magnetic layer to be parallel to a magnetization direction of the fixed magnetic layer. The method also includes supplying a second input voltage of the polarity between the fixed magnetic layer and the free magnetic layer to control the magnetization direction of the free magnetic layer to be antiparallel to the magnetization direction of the fixed magnetic layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 5A is a schematic diagram of a magnetic structure including magnetic layers separated by an oxide layer, and which may employ the STT method of FIG. 3, and includes an illustration of the energy barrier above the Fermi level created by the oxide layer;

FIG. 5B is a graph illustrating that interlayer exchange coupling (IEC) across the oxide layer decreases quickly to a negligible level as thickness of the oxide layer increases;

FIG. 6A is a schematic diagram of a magnetic structure including magnetic layers separated by a spacer layer, and includes an illustration of the spin-dependent quantum-well (QW) formed in the spacer layer with discrete states below the equilibrium Fermi level;

Figure 7A:
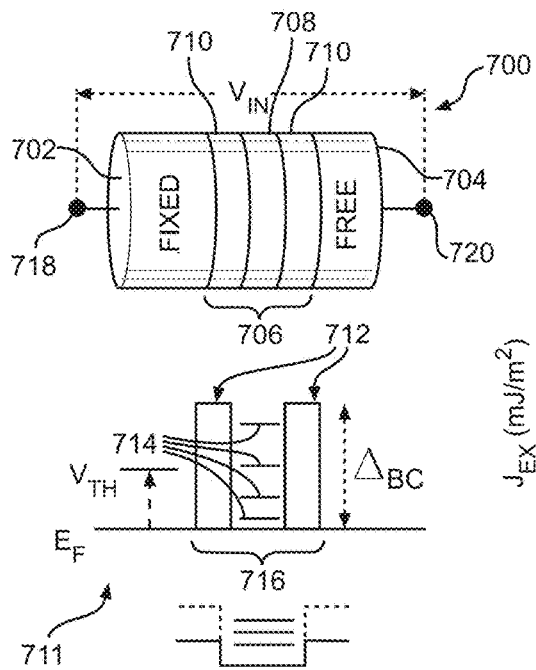
Figure 7B:
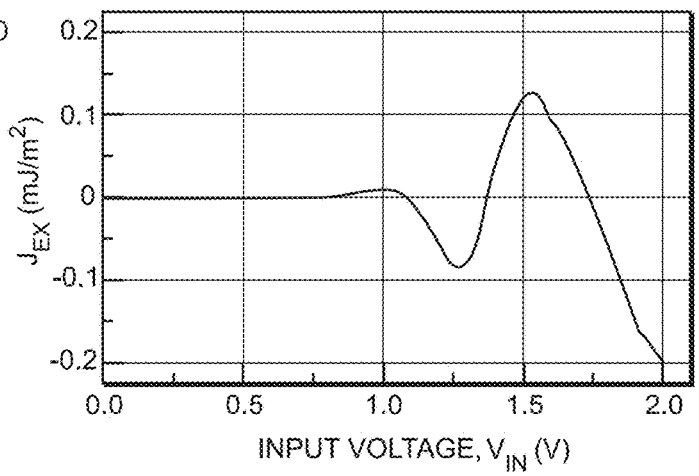
Figure 8A:
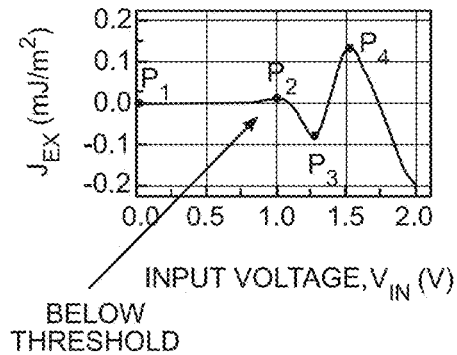
Figure 8B:
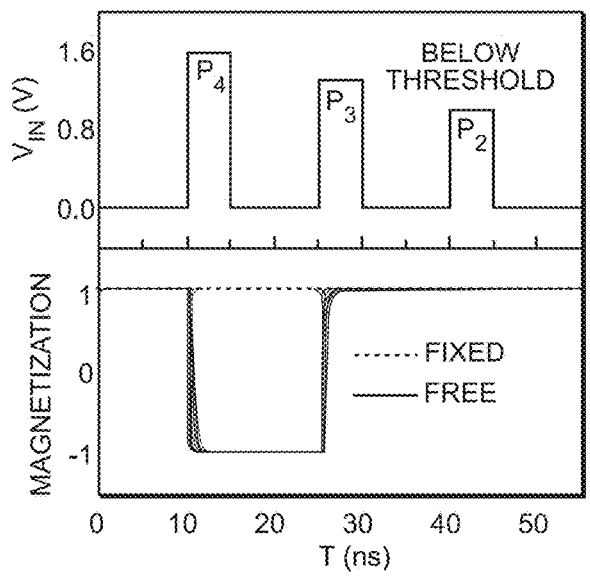
Figure 11A:
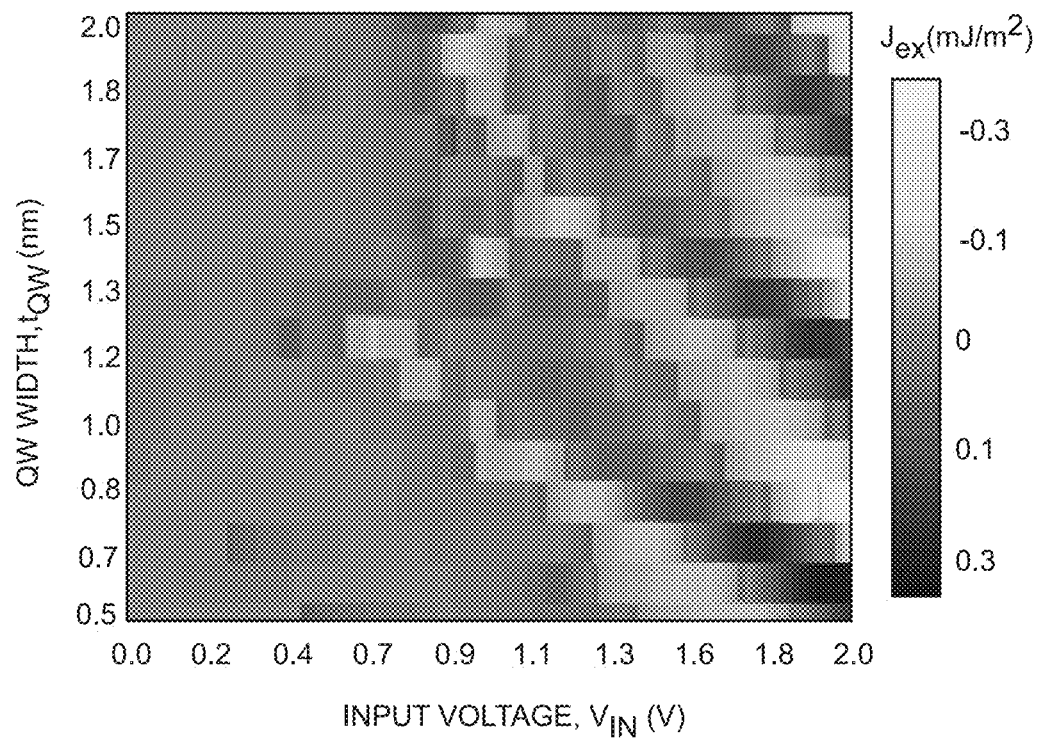
Figure 11B:
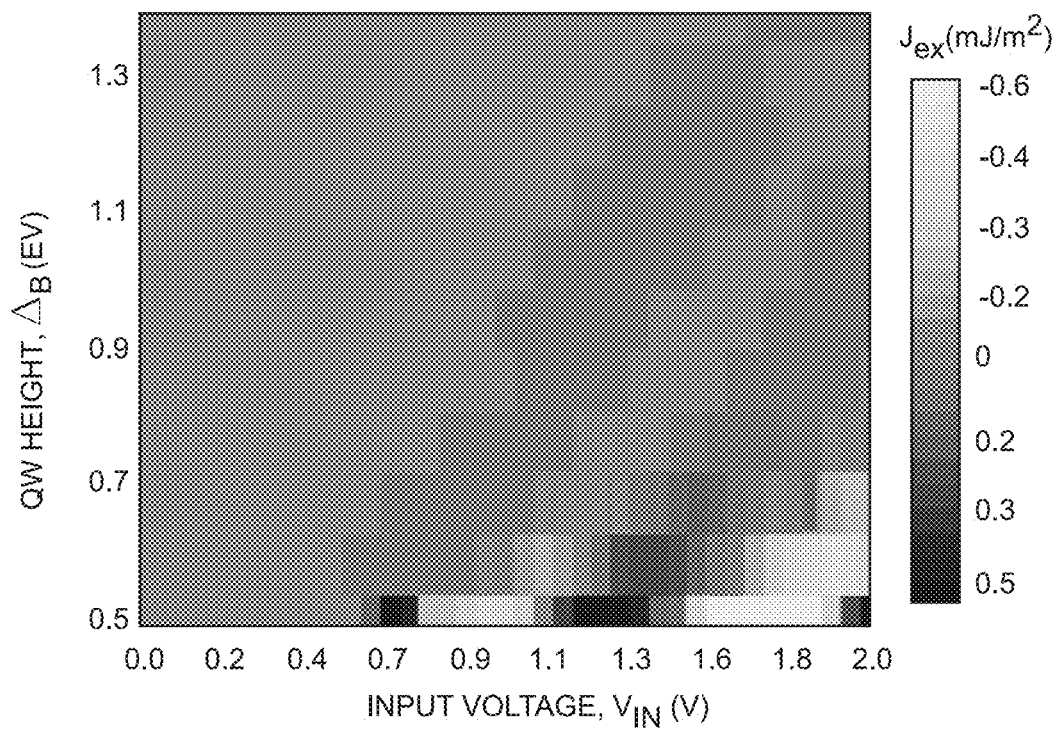
Figure 12:
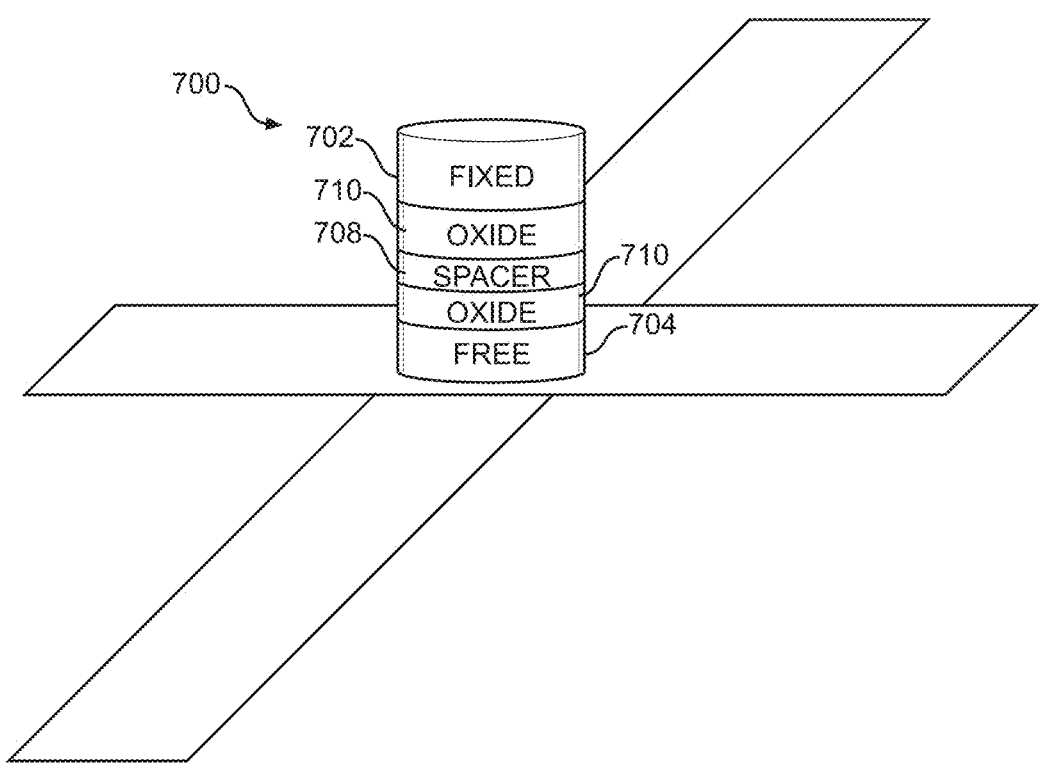
Figure 13:
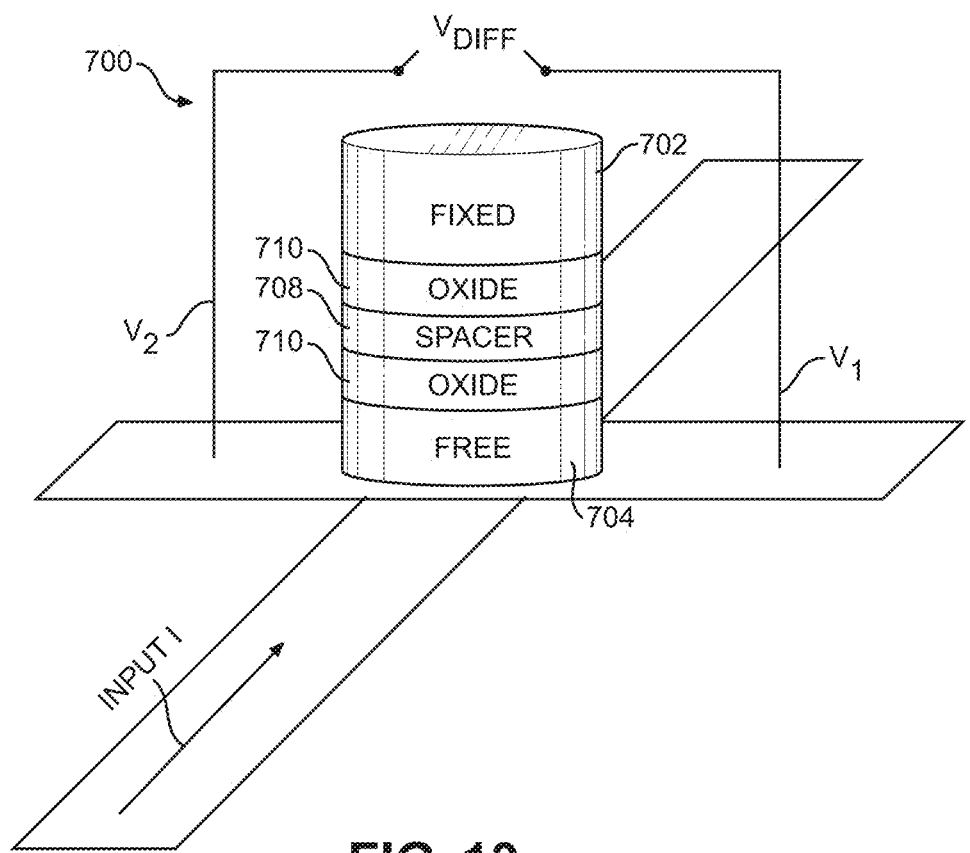
Figure 14:
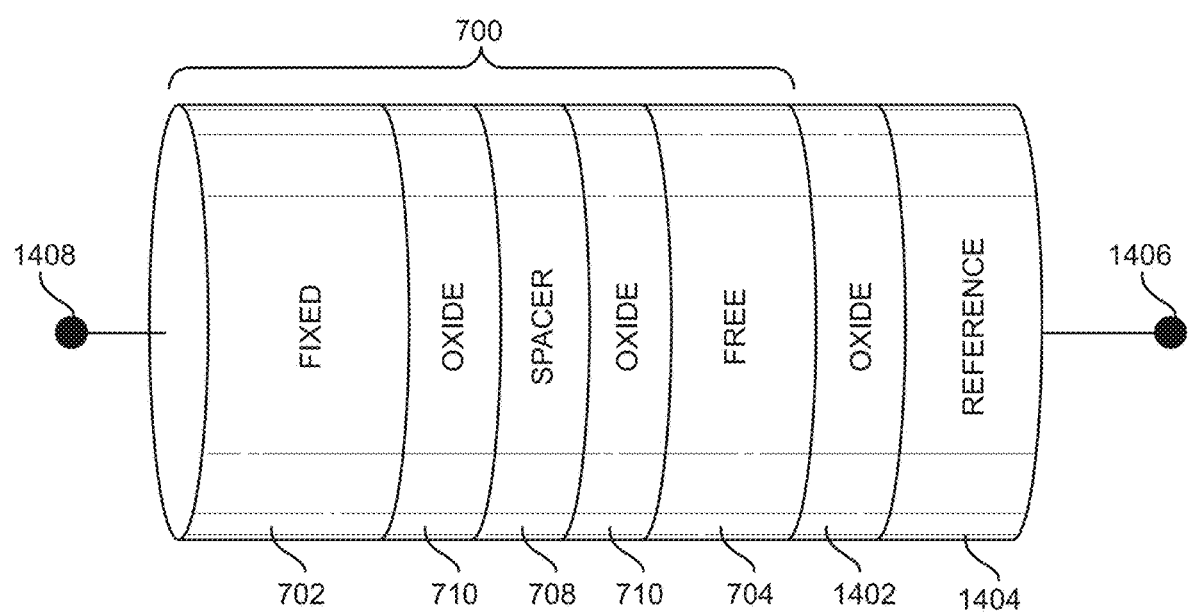

FIG. 6B is a graph illustrating that polarity of the IEC between the fixed magnetic layer and the free magnetic layer oscillates as a function of the thickness of the spacer layer, and oscillatory peaks of the IEC decrease in magnitude with increased spacer thickness. For a particular spacer layer thickness, the free magnetic layer is either parallel or antiparallel to the fixed magnetic layer, if the IEC sign is negative or positive, respectively;

FIG. 7A is a schematic diagram of a magnetic memory structure including a fixed magnetic layer and a free magnetic layer separated by a composite layer including a spacer layer sandwiched between two oxide layers, and includes an illustration of the barriers created by the oxide layers and the discrete energy states in the QW, above the Fermi level, created by the magnetic memory structure. The discrete energy states below the Fermi level in the spacer layer is due to the spin-dependent QW formed because of the mismatch of majority and/or minority spin bands at the magnetic interfaces;

FIG. 7B is a graphic illustration of the IEC in the composite layer in FIG. 7A oscillating between positive and negative values and the IEC peaks increasing in magnitude with an increase in an electric field applied in a direction;

FIG. 8A is the graph in FIG. 7B illustrating that the first peak in the oscillating IEC is below a threshold level for switching a magnetization direction of the free layer;

FIG. 8B includes a graph of a simulation of voltage pulses in a direction across the magnetic memory structure where the voltages in each pulse correspond to the peak voltages shown in FIG. 8A, and includes a corresponding graph of the magnetization directions of the fixed magnetic layer and the free magnetic layer over time;

FIG. 9 shows equations for determining (i) switching threshold, and (ii) switching speed in an STT device;

FIG. 10 shows equations for determining (i) switching threshold, and (ii) switching speed in the magnetic memory structure of FIG. 7A;

FIG. 11A is a graphical representation showing that peaks of the input voltage corresponding to oscillatory peaks of the IEC are observed at a lower input voltage as the width of the QW increases;

FIG. 11B is a graphical representation showing that the input voltage required to maintain a particular magnitude of IEC increases with the height of the QW;

FIGS. 12-14 are schematic diagrams of examples of respective circuits that can be used for determining a state of (e.g., reading) the magnetic memory structure in FIG. 7A.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein include electric-field controlled interlayer exchange coupling (IEC) for magnetization switching. Electronic data stored in a magnetic memory structure can remain stable for a long period of time in the absence of a power source, unlike static random access memory (RAM) (SRAM) and dynamic RAM (DRAM) which lose data when power is removed. Existing magnetic RAM (MRAM) technologies employing current-induced spin-transfer torque (STT) or spin-orbit toque (SOT), however, require a large current density for switching a magnetization direction, which limits advancements in energy efficiency and bit density. A magnetic memory structure disclosed herein makes it possible to employ IEC between a free magnetic layer and a fixed magnetic layer to switch a direction of magnetization in the free magnetic layer under the control of an applied electric field with a significantly lower current density than is required in STT or SOT MRAM devices. The magnetic layers are separated by a composite layer including a spacer layer disposed between two oxide layers. The spacer layer exhibits a large IEC while the oxide layers provide tunnel barriers. The combination of a spacer layer between oxide layers forms a quantum-well (QW) between the magnetic layers with discrete energy states above the equilibrium Fermi level. When an electric field is applied in a direction across the magnetic memory structure, the tunnel barriers become transparent to the wave functions of the magnetic layers at the levels of the discrete energy states via a resonant tunneling phenomenon. This transparency allows the IEC between the fixed magnetic layer and the free magnetic layer to control the magnetization direction of the free magnetic layer to be parallel or antiparallel to the magnetization direction of the fixed magnetic layer depending on the magnitude of the applied electric field in the direction of the electric field. Different magnitudes of electric field induce different signs (i.e., polarities) of IEC. Here, a positive sign of IEC refers to a switching that will yield an antiparallel alignment, and a negative sign of IEC refers to a switching that will yield a parallel alignment. The IEC can be measured as an energy density in units of Joules per square meter. A magnitude of the IEC required to achieve magnetization switching is defined by a threshold value. The IEC threshold value is independent of a parameter describing a Gilbert damping and a parameter for indicating magnets having either in-plane or perpendicular anisotropies of the free magnetic layer, unlike existing MRAM technologies. The threshold value can be controlled by selection of materials, cross-sectional area, and thicknesses of the composite layer. However, the switching time of the magnetic memory structure herein can be optimized by the Gilbert damping and magnetic anisotropy.

Figure 1:
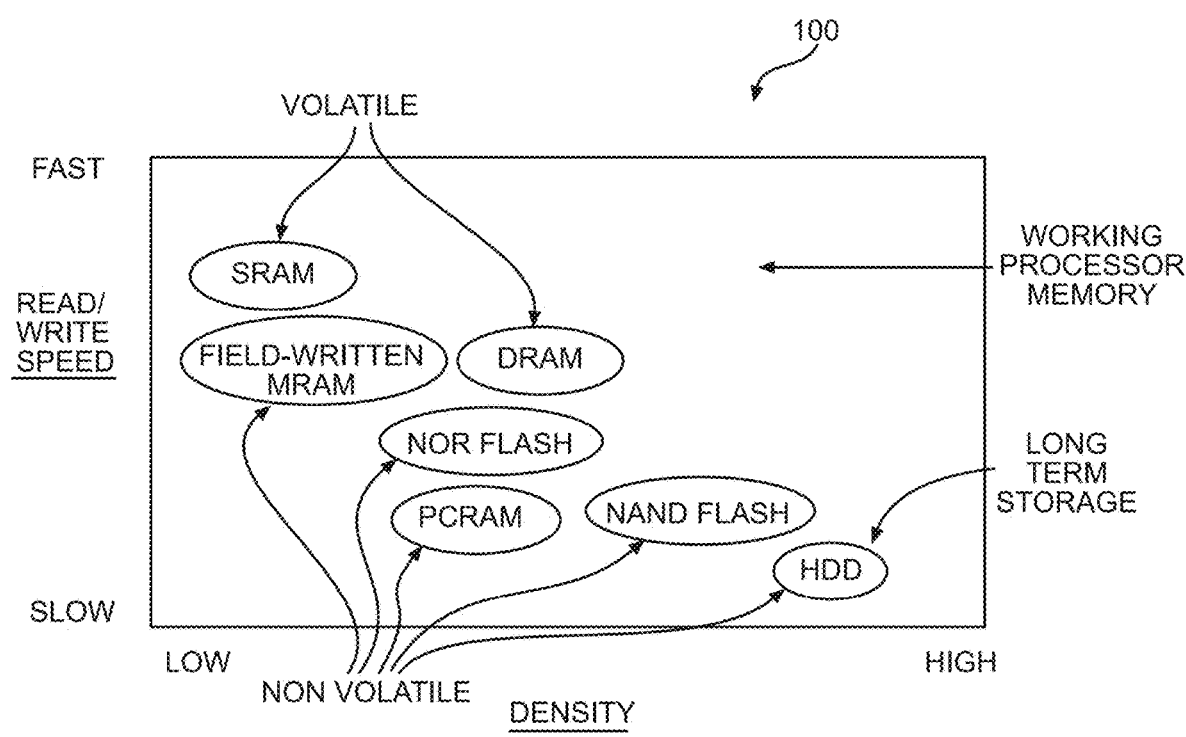
FIG. 1 is a graph comparing read/write speed and density of various electronic data storage technologies.
Figure 2:
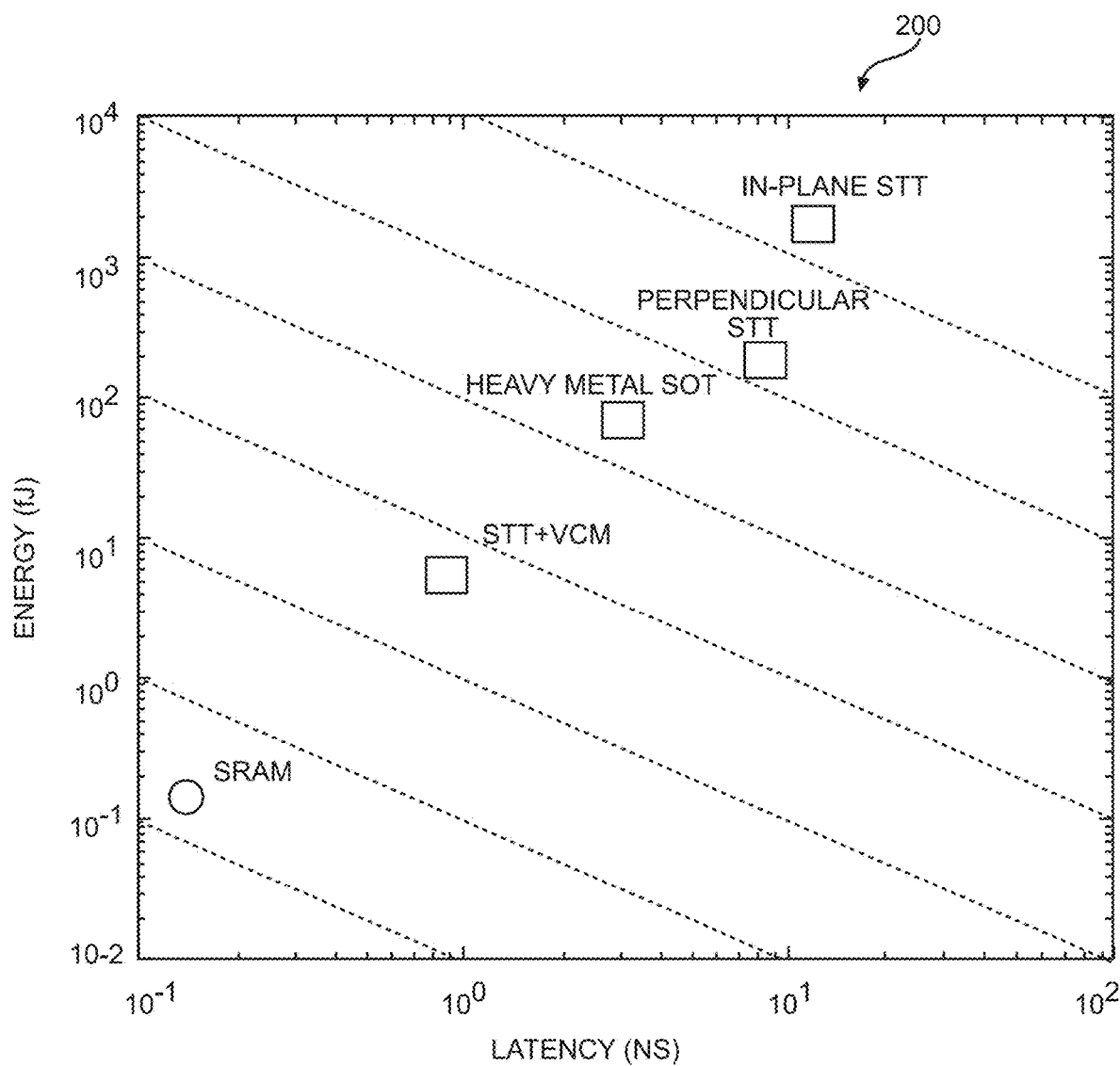
FIG. 2 is a graph comparing energy consumption and access latency of existing magnetic random access memory (RAM) (MRAM) technologies to those of static RAM (SRAM)
Figure 3:
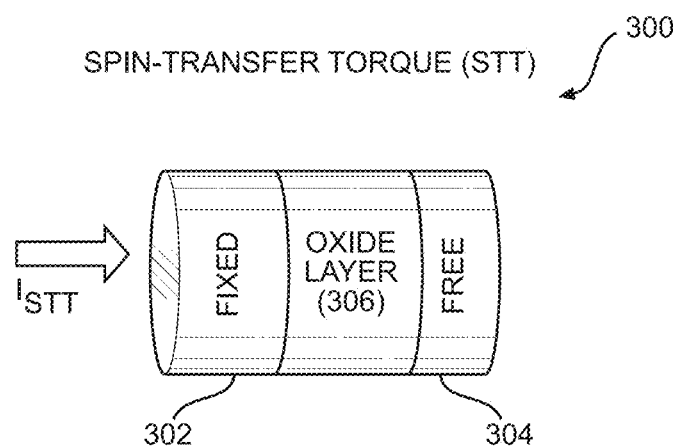
FIG. 3 is a schematic diagram of a magnetic memory structure that employs current induced spin-transfer torque (STT) to set a magnetization direction of a free magnetic layer relative to a magnetization direction of a fixed magnetic layer that is separated from the free magnetic layer by an oxide layer.

To provide a context for the discussion of the magnetic memory structure illustrated in FIG. 7A, existing magnetic memory structures and the methods used for switching a magnetization direction in those structures are first discussed with reference to FIGS. 3-6B. FIG. 3 is a schematic diagram of a magnetic memory structure 300 that employs STT to control a magnetization direction of a free magnetic layer 304 relative to a magnetization direction of a fixed magnetic layer 302 that is separated from the free magnetic layer 304 by an oxide layer 306. The magnetization direction of the free magnetic layer 304 can be set parallel to the magnetization direction of the fixed magnetic layer 302 by a current $I_{STT}$ through the oxide layer 306 in a first direction. The magnetization direction of the free magnetic layer 304 can be set antiparallel to a direction of the fixed magnetic layer by reversing the direction of the current $I_{STT}$. Due to the high current density required to change a magnetization direction using STT, a large amount of power is consumed. The large power requirement limits packaging density, and the high current density can cause reliability problems by breaking down the oxide layer 306. A problem with STT MRAM technology is that the write time for switching the magnetization direction is inversely related to the write current required to switch the device. In other words, to decrease the switching time (e.g., reduce write access latency), the write current must be increased. Thus, reducing the large write current to save power and/or increase density results in slower write access times.

Figure 4:
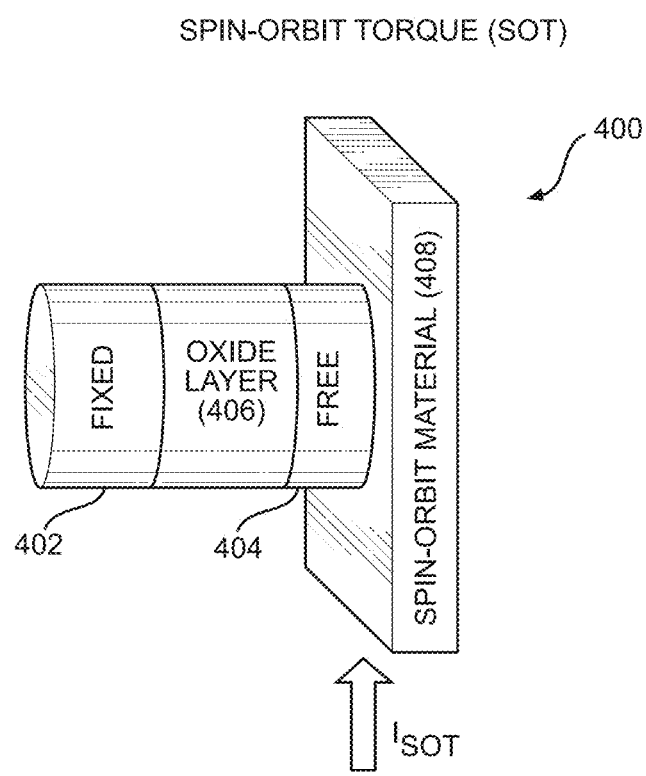
FIG. 4 is a schematic diagram of a magnetic memory structure that employs current induced spin-orbit torque (SOT) from a spin-orbit material to set a magnetization direction of a free magnetic layer relative to a magnetization direction of a fixed magnetic layer that is separated from the free magnetic layer by an oxide layer.

FIG. 4 is a schematic diagram of a magnetic memory structure 400 that employs SOT to control a magnetization direction of a free magnetic layer 404 relative to a magnetization direction of a fixed magnetic layer 402 separated from the free magnetic layer 404 by an oxide layer 406. To set the magnetization direction of the free magnetic layer 404 (i.e., to write data into the magnetic memory structure 400), a current $I_{SOT}$ is passed through a spin-orbit material 408 on a planar side of the free magnetic layer 404 opposite to the oxide layer 406. The current required to write to a memory element using SOT is less than the current required for STT, but the associated power consumption is still prohibitive and limits bit density. In addition, an SOT memory structure 400 is a three-terminal device, which further limits increases in bit density.

FIG. 5A is a schematic diagram of a magnetic memory structure 500 including magnetic layers 502 and 504 separated by an oxide layer 506 wherein the STT or SOT methods of FIGS. 3 and 4 may be employed, and an illustration 508 of an energy barrier 510 created by the oxide layer 506 above the Fermi level $E_F$. The energy barrier 510 illustrated in FIG. 5A has a height $\Delta_{BO}$ that represents an energy barrier that must be overcome for switching magnetization by the STT or SOT methods. FIG. 5B is a graph 512 illustrating IEC, which is a coupling of the wave functions of the respective magnetic layers across the oxide layer 506. In the graph 512, the IEC decreases to a negligible level in the oxide layer 506 as the oxide thickness $D_O$ increases from a few tenths (e.g., 0.3) of a nanometer (nm) to 1 nm and higher. At a smaller thickness, a non-negligible IEC is possible via a tunneling phenomenon, but IEC due to the wave functions of the fixed magnetic layer 502 and the free magnetic layer 504 does not exist in the oxide layer 506 having a thickness above 1 nm.

FIG. 6A is a schematic diagram of a magnetic memory structure 600 including a fixed magnetic layer 602 and a free magnetic layer 604 separated by a non-magnetic spacer layer 606. FIG. 6A also includes an illustration 608 of the discrete energy levels of electrons below the equilibrium Fermi level $E_F$ in the spacer layer 606. Wave functions of the magnetic layers 602 and 604 exist within the spacer layer 606 due to the type of non-magnetic material of which it is formed. Quantum interference between the wave functions of the respective magnetic layers 602 and 604 can be constructive or destructive. The illustration 608 is a representation of majority/minority spin-dependent quantum-wells (QWs) with discrete energy levels within the spacer layer 606 at equilibrium.

As shown in FIG. 6B, the polarity of the IEC (having magnitude $J_{EX}$) between the fixed magnetic layer 602 and the free magnetic layer 604 oscillates as a function of the spacer thickness $D_S$ of the spacer layer 606, and the oscillatory IEC peaks decrease in magnitude with increased spacer thickness. Due to the IEC, the magnetization direction of the free magnetic layer 604 will adopt a ferromagnetic or antiferromagnetic state with respect to the magnetization direction of the fixed magnetic layer 602, depending on the thickness of the spacer layer 606.

FIG. 7A is a schematic diagram of a magnetic memory structure 700 including a fixed magnetic layer 702 and a free magnetic layer 704 separated by a composite layer 706. The composite layer 706 includes a spacer layer 708 and two oxide layers 710. The spacer layer 708 is disposed between the fixed magnetic layer 702 and the free magnetic layer 704. A first oxide layer 710 is disposed between the fixed magnetic layer 702 and the spacer layer 708, and a second oxide layer 710 is disposed between the spacer layer 708 and the free magnetic layer 704. FIG. 7A includes an illustration 711 of barriers 712 created by the oxide layers 710. The illustration 711 also shows the discrete energy states 714 that are made possible in a QW 716 formed in the composite layer 706 in the presence of an applied electric field. The discrete energy states 714 are above the Fermi level $E_F$. The QW 716 is formed in the composite layer 706 between the fixed and free magnetic layers 702 and 704. Below the equilibrium Fermi level, majority/minority spin-dependent QWs with discrete energy levels exist within the spacer layer 708.

The oxide layers 710 create the barriers 712 having a height $\Delta_{BC}$ above the Fermi level $E_F$. The barriers 712 impede the flow of electrons across the spacer layer 708, forming the QW 716. However, due to resonant tunneling phenomena, a transmission coefficient across the oxide layers 710 is increased at the discrete energy states 714 to allow a stronger interaction between the wave functions of the fixed and free magnetic layers 702 and 704. The energy states 714 in the QW 716 may be probed by contact electrochemical potential with an electric field from an input voltage $V_{in}$ applied across the magnetic memory structure 700. A threshold voltage $V_{th}$ is a voltage required to achieve high transmission across the oxide layers 710 via the discrete energy states 714 within the QW 716, to induce an IEC strength greater than the switching threshold value. A magnitude or strength of the IEC depends on the wave function interaction at all quantum energy states in the QW 716, including those below the Fermi level $E_F$, and those above the Fermi level $E_F$ achieved by the application of the electric field based on the input voltage V. The current density in the structure depends only on the quantum energy states in the QW 716, within the separation between two contact Fermi levels. Consequently, the current density flowing in the structure is much lower than in the STT or SOT methods, when a voltage or an electric field is applied to achieve an IEC strength greater than the threshold value.

The magnetic memory structure 700 also includes a first electrode 718 electrically coupled to the fixed magnetic layer 702 and a second electrode 720 electrically coupled to the free magnetic layer 704. The input voltage $V_{in}$ is applied across the first and second electrodes 718 and 720. The magnetic memory structure 700 may be included in a magnetic memory device (not shown).

FIG. 7B is a graphic illustration of the IEC (having a magnitude $J_{EX}$) in the composite layer 706 in FIG. 7A oscillating between positive and negative values and shows the IEC peaks increasing in magnitude with an increase in the electric field applied in a direction based on the input voltage V. The IEC increases significantly when the input voltage $V_{in}$ causes the electron energy within the QW 716 to achieve one of the energy states 714. The sign of the IEC changes polarity between peaks (i.e., at each energy state 714 reached due to the applied electric field). Therefore, the IEC oscillates between positive and negative values that increase in magnitude with an applied input voltage V. In the example in FIG. 7B, a voltage of 1.0 volts (V) achieves a first IEC energy peak of positive polarity. As discussed below, in this example, the energy states 714 of the QW 716 also help reach a second and a third IEC peak, which are negative and positive peaks, respectively, at an input voltage $V_{in}$ of 1.25 V and 1.5 V.

FIG. 8A is the graphic illustration in FIG. 7B with labels at voltage levels $P_1$-$P_4$. The input voltage $V_{in}$ applied to the magnetic memory structure 700 in FIG. 7A at voltage level $P_1$ in FIG. 8A is 0 V. Since there is negligible transmission of electron wave functions across the oxide barriers, IEC at voltage level $P_1$ is also negligible. In the example in FIG. 8A, when the voltage $V_{in}$ is raised to 1.0 V at $P_2$, a sizable positive IEC is achieved via energy states of the QW 716. With a positive IEC at the voltage level $P_2$, there should be an anti-ferromagnetic coupling between the free magnetic layer 704 and the fixed magnetic layer 702. However, magnetization switching does not occur in the magnetic memory structure 700 until the magnitude of the IEC reaches a switching threshold, which is defined by a threshold value of an energy density of IEC. The switching threshold is attained by the input voltage $V_{in}$ shown in the illustration 711 in FIG. 7A. In other words, the magnitude of the IEC is below the switching threshold at the voltage of 1.0 volts at voltage level $P_2$, so the IEC is not strong enough to cause the direction of magnetization in the free magnetic layer 704 to be switched by the magnetization of the fixed magnetic layer 702. As the voltage $V_{in}$ is increased from 1.0 V, the IEC magnitude initially decreases and then becomes an increasing negative value. When the input voltage $V_{in}$ reaches 1.25 V at voltage level $P_3$, another IEC peak with negative polarity is achieved via energy states 714 of the QW 716. With a negative IEC, there should be a ferromagnetic coupling between the free magnetic layer 704 and the fixed magnetic layer 702. The magnitude of the IEC is above the switching threshold at voltage level $P_3$, and the IEC has a negative value, so ferromagnetic coupling causes the direction of magnetization of the free magnetic layer 704 to switch to become parallel to the direction of magnetization of the fixed magnetic layer 702, or causes the direction of magnetization of the free magnetic layer 704 to remain parallel to the direction of magnetization of the fixed magnetic layer 702 if already parallel. When the input voltage $V_{in}$ reaches 1.5 V at voltage level $P_4$, another IEC peak with positive polarity is achieved via energy states 714 of the QW 716. With a positive IEC, there should be an anti-ferromagnetic coupling between the free magnetic layer 704 and the fixed magnetic layer 702. At voltage level $P_4$, with a positive IEC that is above the switching threshold, the direction of magnetization of the free magnetic layer 704 will switch to become antiparallel to the direction of the magnetization of the fixed magnetic layer 702 or the direction of magnetization of the free magnetic layer 704 will remain antiparallel to the direction of magnetization of the fixed magnetic layer 702 if already antiparallel.

Unlike magnetization switching by STT or SOT, employing voltage-controlled IEC to switch a magnetization direction of the free magnetic layer 704 in the magnetic memory structure 700 does not require a change in the polarity of the applied voltage. The switching does not depend on the polarity of the applied voltage but depends on the magnitude. This aspect is shown in the results of a simulation illustrated in FIG. 8B. FIG. 8B includes a graph of a simulation of pulses of the input voltage $V_{in}$ of a polarity (e.g., positive or negative between the fixed magnetic layer 702 and the free magnetic layer 704) creating an electric field in a direction (e.g., through the composite layer 706) across the magnetic memory structure 700. The voltage levels of the pulses in FIG. 8B correspond approximately with the voltage levels $P_4$, $P_3$, and $P_2$ shown in FIG. 8A. FIG. 8B includes a corresponding graph of the magnetization directions of the fixed magnetic layer 702 and the free magnetic layer 704 over time t.

In the example in FIG. 8B, the simulation starts at time t=0 nanoseconds (ns) with the input voltage $V_{in}$=0 V, at which there is negligible IEC in the composite layer 706, and an initial condition in which the directions of magnetization of the respective magnetic layers 702 and 704 are parallel to each other (e.g., both at magnetization of 1). The IEC is negligible at time 0 due to the barriers 712 created by the oxide layers 710 in FIG. 7A. At an input voltage $V_{in}$ of 0 V, the direction of magnetization of the free magnetic layer 704 will remain stable.

At time t=10 ns, in the example in FIG. 8B, the input voltage $V_{in}$ is raised to 1.6 V, which corresponds to a positive IEC (anti-ferromagnetic) and the magnitude is above the switching threshold. After a minimum switching time $T_{IEC}$ (not shown), the IEC causes the direction of the magnetization of the free magnetic layer 704 to switch from being parallel to being antiparallel to the direction of magnetization of the fixed magnetic layer 702. After a certain time greater than the minimum switching time $T_{IEC}$, the input voltage $V_{in}$ returns to 0 V, at which the direction of magnetization of the free magnetic layer 704 will remain stable until application of another input voltage $V_{in}$ greater than the threshold voltage $V_{th}$.

At time t=25 ns, in the example in FIG. 8B, the input voltage $V_{in}$ is raised to 1.3 V, which corresponds to a negative IEC (ferromagnetic) and the magnitude is above the switching threshold. After the minimum switching time $T_{IEC}$, the IEC causes the direction of the magnetization of the free magnetic layer 704 to switch back from being antiparallel to being parallel to the direction of the magnetization of the fixed magnetic layer 702. After a certain time greater than the minimum switching time $T_{IEC}$, the input voltage $V_{in}$ returns to 0 V, where the direction of magnetization of the free magnetic layer 704 will remain stable until application of another input voltage $V_{in}$ greater than the threshold voltage $V_{th}$.

At time t=40 ns, in the example in FIG. 8B, the input voltage $V_{in}$ is raised from 0 V to 1.0 V, which corresponds to a positive IEC (anti-ferromagnetic), but the magnitude of the IEC is below the switching threshold. Thus, the direction of magnetization of the free magnetic layer 704 remains unchanged (i.e., parallel to the direction of magnetization of the fixed magnetic layer 702).

The voltage levels $P_3$ and $P_4$ are shown in FIG. 8B as square waves having instantaneous rise times and fall times. In practice, the rise times of the input voltage $V_{in}$ should be approximately 10 picoseconds (ps) and the fall times should be approximately 10 ps. The input voltage $V_{in}$ corresponding to voltage level $P_4$ at a higher energy state 714 of the QW 716 should be reduced quickly to 0 V to avoid unintentionally changing the magnetization direction. For example, if the input voltage $V_{in}$ is raised to 1.6 V to set the magnetization directions to be antiparallel, and the voltage then decreases slowly, such that the input voltage $V_{in}$ is near 1.3 V for at least the minimum switching time $T_{IEC}$, the magnetization of the free layer 704 could unintentionally return to a parallel state (e.g., corresponding to voltage level $P_3$).

As shown in FIG. 8B, in the magnetic memory structure 700 in FIG. 7A, the magnetization direction of the free magnetic layer 704 relative to the magnetization direction of the fixed magnetic layer 702 becomes antiparallel in response to a first input voltage $V_{in}$ (e.g., 1.6 V at point $P_4$) having a polarity between the fixed magnetic layer 702 and the free magnetic layer 704, and parallel in response to a second input voltage $V_{in}$ (e.g., 1.3 V at point $P_3$) having the same polarity between the fixed magnetic layer 702 and the free magnetic layer 704, wherein a magnitude of the first input voltage $V_{in}$ is different than a magnitude of the second input voltage $V_{in}$. In other words, the polarity of the first input voltage $V_{in}$ is the same as the polarity of the second input voltage $V_{in}$ and both may be either positive or negative.

The first input voltage $V_{in}$ and the second input voltage $V_{in}$ are each applied between the first electrode 718 and the second electrode 720 of the magnetic memory structure 700 in FIG. 7A. The first input voltage $V_{in}$ and the second input voltage $V_{in}$ increase the IEC between the fixed magnetic layer 702 and the free magnetic layer 704 above a threshold at which the magnetization direction of the free magnetic layer 704 may be changed by the magnetization direction of the fixed magnetic layer 702.

In one example, the magnetic memory structure 700 is configured to switch the magnetization direction of the free magnetic layer 704 relative to the magnetization direction of the fixed magnetic layer 702 from antiparallel to parallel in response to the first input voltage $V_{in}$, and from parallel to antiparallel in response to the second input voltage V.

As discussed above, the magnetization direction of the free magnetic layer 704 may be switched by IEC in the presence of a voltage-controlled electric field corresponding to a discrete energy state 714 of the QW 716 formed by the composite layer 706. The pulses of the input voltage $V_{in}$ illustrated in FIG. 8B provide an IEC with a magnitude above a switching threshold and a duration of at least a minimum switching time $T_{IEC}$ required for switching the magnetization direction. The IEC strength (magnitude) required for magnetization switching is defined by a current density. As noted above with regard to the examples in FIGS. 3 and 4, in which the magnetization of the magnetic memory structures 300 and 400 are switched by STT and SOT, respectively, it was noted that those methods require a large current density. The large current density causes excessive power consumption, breaks down the oxide layer, and prevents a high bit density. The write time for switching the magnetization direction using STT is inversely related to the write current required to switch the device. This relationship is shown in the equations in FIG. 9.

FIG. 9 shows (i) a switching threshold equation for determining a current density $J_{STT0}$ and (ii) a switching speed equation for determining a minimum switching time $T_{s0}$. The current density $J_{STT0}$ and switching time $T_{s0}$ are required for switching a magnetization direction using STT. Each of the switching threshold equation and the switching speed equation includes the Gilbert damping factor $\alpha_g$, which creates a trade-off due to an inverse relationship between the current density $J_{STT0}$ and switching time $T_{s0}$. For example, to reduce the large current density $J_{STT0}$, to avoid high power consumption, etc., the Gilbert damping factor $\alpha_g$ could be reduced, but a reduction in the Gilbert damping factor $\alpha_g$ would increase the switching time $T_{s0}$.

In contrast to the equations in FIG. 9 for magnetization switching using STT, the corresponding equations for magnetization switching employing voltage controlled IEC are shown in FIG. 10. It is significant to note that, while the switching speed equation in FIG. 10 includes the Gilbert damping factor $\alpha_g$, the Gilbert damping factor $\alpha_g$ is not included in the switching threshold equation in FIG. 10. A voltage required between the fixed magnetic layer 702 and the free magnetic layer 704 (i.e., an input voltage $V_{in}$ applied between the first and second electrodes 718 and 720) is determined by a total current $I_{SW}$, which can be determined by the product of the surface area S of the magnetic memory structure 700 and the IEC energy density $J_{ex}$, which provides the threshold IEC required for magnetization switching therein. The IEC energy threshold $J_{ex0}$ satisfies the equation:

$$J_{IEC0}=(E_1 \times E_2)/(S(E_1+E_2)), \text{ wherein:}$$

$J_{IEC0}$=a minimum energy density threshold of the IEC needed for switching the magnetization direction of the free magnetic layer, and is measured in units of Joule per square meter;

S=the cross-sectional area of the magnetic memory structure;

$E_1$=the thermal energy barrier of the fixed magnetic layer, which satisfies the equation:

$$E_1=(M_{s1}H_{k1}\Omega_1)/2, \text{ wherein:}$$

$M_{s1}$=saturation magnetization of the fixed magnetic layer;
$H_{k1}$=anisotropy field of the fixed magnetic layer;
$\Omega_1$=volume of the fixed magnetic layer; and
$E_2$=the thermal energy barrier of the free magnetic layer, which satisfies the equation:

$$E_2=(M_{s2}H_{k2}\Omega_2)/2, \text{ wherein:}$$

$M_{s2}$=saturation magnetization of the free magnetic layer;
$H_{k2}$=anisotropy field of the free magnetic layer; and
$\Omega_2$=volume of the free magnetic layer.

The time $T_{IEC}$ for switching the magnetization direction of the free magnetic layer 704 in response to the input voltage $V_{in}$ between the fixed magnetic layer 702 and the free magnetic layer 704 satisfies the switching speed equation in FIG. 10:

$$T_{IEC}=((8(\sqrt{\pi})|J_{IEC0}|)/(\alpha_g\gamma(H_{k2}+n2\pi M_{s2})|J_{IEC}|))(\pi/2-\theta_0), \text{ wherein:}$$

$J_{IEC0}$=energy density threshold of IEC needed for switching the magnetization direction in the free magnetic layer;
$\alpha_g$=the Gilbert damping factor of the free magnetic layer;
$\gamma$=the electron gyromagnetic ratio in units of radian per second per tesla;
$H_{k2}$=the anisotropy field of the free magnetic layer;
$J_{IEC}$=the induced IEC energy density due to electric field created by applied input voltage;
$\theta_0$=the initial angle between the directions of magnetization of the fixed magnetic layer and the free magnetic layer in the units of radians;
n=0 for a free magnet with perpendicular anisotropy; and
n=1 for a free magnet with in-plane anisotropy.

The equation above for determining the minimum switching time $T_{IEC}$, measured in units of seconds, includes the Gilbert damping factor $\alpha_g$ and the parameter n that determines in-plane (when n=1) or perpendicular (when n=0) anisotropy of the free magnetic layer 704, but the equation for determining the IEC energy threshold $J_{IEC0}$) does not. This contrasts to the situation of STT MRAM, in which the current density required to switch a magnetization direction depends on both the Gilbert damping factor $\alpha_g$ and the parameter n that determines whether the free magnetic layer has in-plane or perpendicular anisotropy. The energy density required for switching in STT is directly proportional to the Gilbert damping factor, but the minimum switching time is inversely proportional to the Gilbert damping factor $\alpha_g$. Thus, reducing the energy density (i.e., current density) required to switch a magnetization direction in an STT type MRAM increases the minimum time for switching. Thus, STT suffers from a trade-off between current density and switching time. In the magnetic memory structure 700, however, reducing the energy density (i.e., threshold IEC, $J_{IEC0}$) needed to switch the magnetization direction of the free layer 704 can also reduce the minimum switching time $T_{IEC}$.

The STT switching threshold is proportional to $E_2$, whereas the IEC switching threshold $J_{IEC0}$ is proportional to an effective combination of $E_1$ and $E_2$. Thus, the effective combination yields a value $<E_2$ and reaches $E_2$ as a maximum value when $E_1 >> E_2$. As apparent in the above equations, both IEC and STT switching speeds depend on the Gilbert damping factor $\alpha_g$ and the parameter n of the free magnetic layer that determines whether the free magnetic layer has an in-plane or a perpendicular anisotropy, and both switching speeds can be reduced with an increase in the applied energy density (e.g., when $J_{IEC} > J_{IEC0}$).

Unlike STT, in which switching speed depends on the initial angle $\theta_0$ between the magnetization directions of the fixed magnetic layer and the free magnetic layer in a logarithmic way, IEC switching speed is linearly dependent on the initial angle $\theta_0$.

Some of the variables in the equations above are determined by the materials of which the respective layers of the magnetic memory structure 700 are formed and the dimensions of those respective layers. In the example in the simulation illustrated in FIG. 8B, the fixed magnetic layer 702 is formed of -cobalt (Co) having a thickness of 10 nm. The free magnetic layer 704 is formed of Co having a thickness of 1 nm. The oxide layers 710 are formed of magnesium oxide (MgO) having a thickness of about 1 nm. The spacer layer 708 is formed of ruthenium (Ru) having a thickness of 0.8 nm.

However, the magnetic memory structure 700 disclosed herein is not limited to the materials and dimensions of the example of FIG. 8B. For example, the fixed magnetic layer 702 and the free magnetic layer 704 may each be formed from any one of iron (Fe), cobalt (Co), nickel (Ni), and an alloy of Fe, Co or Ni. The fixed magnetic layer 702 may have a thickness in the range of 5 to 100 nm, and the free magnetic layer 704 may have a thickness in the range of 1 to 3 nm.

The first and second oxide layers 710 may each be formed of any one of MgO, magnesium zinc oxide (MgZnO), aluminum monoxide (AlOx) (thermally grown), iron oxide (Fe2O3), titanium oxide (TiO2), zinc oxide (ZnO), niobium oxide (Nb2O5), rhodium oxide (Rh2O3), tantalum oxide (Ta2O3), vanadium oxide (V2O5), aluminum oxide (Al2O3), and hafnium oxide (HfO2). The first and second oxide layers 710 may each have a thickness in the range of 0.5 to 3 nm.

The spacer layer 708 may be formed of any one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi). The spacer layer 708 may have a thickness in the range of 0.1 to 4 nm.

In another example, a method of setting the magnetization direction of the free magnetic layer 704 in the magnetic memory structure 700 includes supplying a first input voltage $V_{in}$ of a polarity between the fixed magnetic layer 702 and the free magnetic layer 704, which are separated by a composite layer, to control the magnetization direction of the free magnetic layer 704 to be parallel to the magnetization direction of the fixed magnetic layer 702, and supplying a second input voltage $V_{in}$ of the polarity between the fixed magnetic layer 702 and the free magnetic layer 704 to control the magnetization direction of the free magnetic layer 704 to be antiparallel to the magnetization direction of the fixed magnetic layer 702. The time $T_{IEC}$ required for supplying the input voltage $V_{in}$ to set the magnetization direction of the free magnetic layer 704 relative to the magnetization direction of the fixed magnetic layer 702 is directly related to the magnitude of the input voltage $V_{in}$ supplied.

FIG. 11A is a graphical representation showing that the peaks of the oscillatory IEC appear at lower input voltage $V_{in}$ with an increasing width of the QW 716, which corresponds to the thickness of the spacer layer 708. FIG. 11A also shows that the magnitude of the input voltage $V_{in}$ required to achieve a peak (positive or negative) in the magnitude of the IEC is inversely related to the thickness of the spacer layer 708. In other words, the magnitude of the input voltage decreases as the thickness of the spacer layer 708 is increased. Thus, in the magnetic memory structure 700, the magnetization direction of the free magnetic layer 704 relative to the magnetization direction of the fixed magnetic layer 702 corresponds to the magnitude of the input voltage $V_{in}$ between the fixed magnetic layer 702 and the free magnetic layer 704, and the magnitude of the input voltage $V_{in}$ is inversely related to the thickness of the spacer layer 708. However, increasing the thickness of the spacer layer 708 increases the distance between the fixed magnetic layer 702 and the free magnetic layer 704; hence the IEC strength decreases.

Thus, in the magnetic memory structure 700, a first magnetization direction of the free magnetic layer 704 relative to the magnetization direction of the fixed magnetic layer 702 (e.g., parallel or antiparallel) corresponds to a first magnitude of an input voltage $V_{in}$ of a polarity (e.g., positive or negative) between the fixed magnetic layer 702 and the free magnetic layer 704. For example, at a QW width of 0.8 nm, a negative peak of IEC is observed at an input voltage $V_{in}$ magnitude of approximately 1.2 V. A second magnetization direction of the free magnetic layer 704 relative to the magnetization direction of the fixed magnetic layer 702 (e.g., antiparallel or parallel) corresponds to a second magnitude of the input voltage $V_{in}$ of the same polarity (e.g., positive or negative) between the fixed magnetic layer 702 and the free magnetic layer 704. For example, at the QW width of 0.8 nm, a positive peak of IEC is observed at an input voltage $V_{in}$ magnitude of approximately 1.5 V. As shown in FIG. 11A, at a QW width of 0.9 nm, a negative peak of IEC is observed at an input voltage $V_{in}$ magnitude of approximately 1.1 V, and a positive peak of IEC is observed at an input voltage $V_{in}$ magnitude of approximately 1.3 V. Thus, the first magnitude of the input voltage $V_{in}$ and the second magnitude of the input voltage $V_{in}$ depend on the QW width, which corresponds to a thickness of the spacer layer 708. Specifically, since the input voltage magnitudes for observing peaks decrease with an increase in QW width, the first magnitude of the input voltage $V_{in}$ and the second magnitude of the input voltage $V_{in}$ are inversely related to the thickness of the spacer layer 708.

FIG. 11B is a graphical representation showing that the input voltage $V_{in}$ required to maintain a particular magnitude of IEC (i.e., $J_{ex}$) increases with the height of the QW 716. That is, the magnitude of the IEC diminishes with an increase in height of the QW 716, even in the presence of a higher input voltage V. Thus, FIGS. 11A and 11B illustrate how the height and width of the QW 716 can be used to adjust a range of the input voltage $V_{in}$, the magnitude of the IEC, and the current density in the structure.

The electrical resistance of the magnetic memory structure 700 in the condition that the magnetization directions of the fixed and free magnetic layers 702 and 704 are antiparallel is higher than the electrical resistance of the magnetic memory structure 700 in the condition that the magnetization directions of the fixed and free magnetic layers 702 and 704 are parallel. The parallel or antiparallel state represents a binary value, and binary data is written into the magnetic memory structure 700 by setting the relative magnetization directions to be parallel or antiparallel, as discussed above. The data (e.g., binary value) stored in the magnetic memory structure 700 may be determined by several means, as described with regard to FIGS. 12-14.

In the configuration of the magnetic memory structure 700 illustrated in FIG. 12, the fixed magnetic layer 702 and the free magnetic layer 704 have perpendicular magnetic anisotropy (pma). The free magnetic layer 704 is deposited on a Hall bar geometry. A current is run in one of the hands of the hall bar and an anomalous Hall voltage is measured across the other hand perpendicular to the current flow, which is perpendicular to the current flowing hand. In order to read the magnetization using the anomalous Hall voltage, the easy axis of the free magnetization should be perpendicular to the both hands of the hall bar, hence, a free magnet with perpendicular anisotropy is required for this read-out method. Depending on whether the free magnetic layer 704 is pointing outward from the Hall bar plane or inward toward the Hall bar plane, the measured Hall voltage will be high or low, respectively. Note that the reading of the free magnetic layer information does not depend on the fixed magnetic layer configuration of the magnetic memory structure 700 shown in FIG. 12.

In the configuration of the magnetic memory structure 700 illustrated in FIG. 13, a fixed read current input "I" is passed across the end of the free magnetic layer 704. Depending on a direction of magnetization of the free magnetic layer 704, the magnetic field therein creates a voltage differential $V_{DIFF}$ between $V_1$ and $V_2$. This apparatus uses a method known as the Hall effect. By measuring the voltage $V_{DIFF}$, the direction of magnetization (i.e., the state of the magnetic memory structure 700) can be determined.

In the configuration illustrated in FIG. 14, in a case in which the magnetoresistance of the magnetic memory structure 700 may be too low to easily distinguish between the antiparallel and parallel states of magnetization directions, additional layers such as oxide layer 1402 and reference layer 1404 can be added to enhance the difference in magnetoresistance between the respective states. A voltage applied between the contacts 1406 and 1408 can be used to determine the magnetoresistance, and thus the state of the magnetic memory structure 700.

Those skilled in the art will recognize improvements and modifications to the preferred embodiments of the present disclosure. All such improvements and modifications are considered within the scope of the concepts disclosed herein and the claims that follow.

What is claimed is:

1. A magnetic memory structure, comprising:
   a fixed magnetic layer;
   a free magnetic layer; and
   a non-magnetic composite layer disposed between the fixed magnetic layer and the free magnetic layer;
   wherein a magnetization direction of the free magnetic layer relative to a magnetization direction of the fixed magnetic layer is:
   parallel in response to a first input voltage of a polarity between the fixed magnetic layer and the free magnetic layer, and
   antiparallel in response to a second input voltage of the polarity between the fixed magnetic layer and the free magnetic layer.

2. The magnetic memory structure of claim 1, wherein:
   a magnitude of the first input voltage is different than a magnitude of the second input voltage.

3. The magnetic memory structure of claim 1, wherein the magnetic memory structure is configured to switch the magnetization direction of the free magnetic layer relative to the magnetization direction of the fixed magnetic layer from antiparallel to parallel in response to the first input voltage, and from parallel to antiparallel in response to the second input voltage.

4. The magnetic memory structure of claim 1, wherein the non-magnetic composite layer comprises:
   a non-magnetic spacer layer disposed between the fixed magnetic layer and the free magnetic layer;
   a first oxide layer disposed between the fixed magnetic layer and the spacer layer; and
   a second oxide layer disposed between the spacer layer and the free magnetic layer.

5. The magnetic memory structure of claim 1, wherein:
   each of the fixed magnetic layer and the free magnetic layer comprises any one of iron (Fe), cobalt (Co), nickel (Ni), and an alloy of Fe, Co or Ni.

6. The magnetic memory structure of claim 4, wherein:
   the first oxide layer and the second oxide layer each comprise any one of magnesium oxide (MgO), magnesium zinc oxide (MgZnO), aluminum monoxide (AlOx) (thermally grown), iron oxide (Fe2O3), titanium oxide (TiO2), zinc oxide (ZnO), niobium oxide (Nb2O5), rhodium oxide (Rh2O3), tantalum oxide (Ta2O3), vanadium oxide (V2O5), aluminum oxide (Al2O3), and hafnium oxide (HfO2).

7. The magnetic memory structure of claim 4, wherein:
   the spacer layer comprises any one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi).

8. The magnetic memory structure of claim 1, further comprising:
   a first electrode electrically coupled to the fixed magnetic layer; and
   a second electrode electrically coupled to the free magnetic layer;
   wherein the first input voltage and the second input voltage are each applied between the first electrode and the second electrode.

9. The magnetic memory structure of claim 1, wherein the first input voltage and the second input voltage increase interlayer exchange coupling (IEC) between the fixed magnetic layer and the free magnetic layer above a threshold at which the magnetization direction of the free magnetic layer is determined by the magnetization direction of the fixed magnetic layer.

10. The magnetic memory structure of claim 4, wherein:
    the fixed magnetic layer has a thickness of 10 nanometers (nm);
    the free magnetic layer has a thickness of 1 nm;
    the first oxide layer and the second oxide layer each have a thickness of 1 nm; and
    the spacer layer has a thickness of 0.8 nm.

11. A magnetic memory structure, comprising:
a fixed magnetic layer;
a free magnetic layer; and
a composite layer providing a quantum well between the fixed magnetic layer and the free magnetic layer;
wherein:
a magnetization direction of the free magnetic layer relative to a magnetization direction of the fixed magnetic layer corresponds to an interlayer exchange coupling (IEC) in the composite layer based on a magnitude of an input voltage between the fixed magnetic layer and the free magnetic layer.

12. The magnetic memory structure of claim 11, wherein:
an IEC energy density threshold for switching the magnetization direction of the free magnetic layer relative to the magnetization direction of the fixed magnetic layer is independent of a Gilbert damping factor of the free magnetic layer.

13. The magnetic memory structure of claim 11, wherein:
an IEC energy density threshold for switching the magnetization direction of the free magnetic layer relative to the magnetization direction of the fixed magnetic layer is independent of a parameter that indicates the magnetic anisotropy of the free magnetic layer being in-plane or perpendicular.

14. The magnetic memory structure of claim 11, wherein the IEC based on the magnitude of the input voltage between the fixed magnetic layer and the free magnetic layer comprises an energy density $J_{IEC0}$ that satisfies the equation:

$$J_{IEC0} = (E_1 \times E_2)/(S(E_1 + E_2)), \text{wherein:}$$

$J_{IEC0}$=minimum energy density threshold of the IEC needed for switching the magnetization direction of the free magnetic layer, and is measured in units of Joule per square meter;
S=cross-sectional area of the magnetic memory structure;
$E_1$=thermal energy barrier of the fixed magnetic layer, which satisfies the equation:

$$E_1 = (M_{s1} H_{k1} \Omega_1)/2, \text{wherein:}$$

$M_{s1}$=saturation magnetization of the fixed magnetic layer;
$H_{k1}$=anisotropy field of the fixed magnetic layer; and
$\Omega_1$=volume of the fixed magnetic layer; and
$E_2$=thermal energy barrier of the free magnetic layer, which satisfies the equation:

$$E_2 = (M_{s2} H_{k2} \Omega_2)/2, \text{wherein:}$$

$M_{s2}$=saturation magnetization of the free magnetic layer;
$H_{k2}$=anisotropy field of the free magnetic layer; and
$\Omega_2$=volume of the free magnetic layer.

15. The magnetic memory structure of claim 11, wherein a time for switching the magnetization direction of the free magnetic layer in response to the input voltage between the fixed magnetic layer and the free magnetic layer satisfies the equation:

$$T_{IEC} = ((8(\pi^{-1})|J_{IEC0}|)/(\alpha_g \gamma (H_{k2} + n 2\pi M_{s2})|J_{IEC0}|(\pi/2 - \theta_0), \text{wherein:}$$

$J_{IEC0}$=energy density threshold of interlayer exchange coupling (IEC) needed for switching the magnetization direction in the free magnetic layer;
$\alpha_g$=Gilbert damping factor of the free magnetic layer;
$\gamma$=electron gyromagnetic ratio in units of radian per second per tesla;
$H_{k2}$=anisotropy field of the free magnetic layer;
$J_{IEC0}$=induced IEC energy density due to electric field created by applied input voltage;
$\theta_0$=initial angle between the magnetization directions of the fixed magnetic layer and the free magnetic layer in units of radians;
n=0 for a free magnet with perpendicular anisotropy; and
n=1 for a free magnet with in-plane anisotropy.

16. The magnetic memory structure of claim 15, wherein:
the magnetization direction of the free magnetic layer relative to the magnetization direction of the fixed magnetic layer is:
parallel in response to a first input voltage between the fixed magnetic layer and the free magnetic layer, and
antiparallel in response to a second input voltage between the fixed magnetic layer and the free magnetic layer.

17. The magnetic memory structure of claim 11, wherein:
each of the fixed magnetic layer and the free magnetic layer comprises any one of iron (Fe), cobalt (Co), nickel (Ni), and an alloy of Fe, Co or Ni.

18. The magnetic memory structure of claim 11, wherein the composite layer comprises:
a spacer layer providing the quantum well and disposed between the fixed magnetic layer and the free magnetic layer;
a first oxide layer disposed between the fixed magnetic layer and the spacer layer; and
a second oxide layer disposed between the spacer layer and the free magnetic layer.

19. The magnetic memory structure of claim 18, wherein:
the first oxide layer and the second oxide layer each comprise any one of magnesium oxide (MgO), magnesium zinc oxide (MgZnO), aluminum monoxide (AlOx) (thermally grown), iron oxide (Fe2O3), titanium oxide (TiO2), zinc oxide (ZnO), niobium oxide (Nb2O5), rhodium oxide (Rh2O3), tantalum oxide (Ta2O3), vanadium oxide (V2O5), aluminum oxide (Al2O3), and hafnium oxide (HfO2).

20. The magnetic memory structure of claim 18, wherein:
the spacer layer comprises any one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi).

21. A magnetic memory structure, comprising:
a fixed magnetic layer;
a free magnetic layer; and
a composite layer disposed between the fixed magnetic layer and the free magnetic layer, the composite layer comprising:
a spacer layer disposed between the fixed magnetic layer and the free magnetic layer;
a first oxide layer disposed between the fixed magnetic layer and the spacer layer; and
a second oxide layer disposed between the spacer layer and the free magnetic layer;
wherein:
the spacer layer provides a large interlayer exchange coupling (IEC) between the fixed magnetic layer and the free magnetic layer relative to the first oxide layer and the second oxide layer;
a first magnetization direction of the free magnetic layer relative to a magnetization direction of the fixed magnetic layer corresponds to a first magnitude of an input voltage of a polarity between the fixed magnetic layer and the free magnetic layer;

a second magnetization direction of the free magnetic layer relative to the magnetization direction of the fixed magnetic layer corresponds to a second magnitude of the input voltage of the polarity between the fixed magnetic layer and the free magnetic layer; and the first magnitude of the input voltage and the second magnitude of the input voltage depend on a thickness of the spacer layer.

22. The magnetic memory structure of claim 21, wherein: the first magnitude of the input voltage and the second magnitude of the input voltage are inversely related to the thickness of the spacer layer.

23. The magnetic memory structure of claim 21, wherein: each of the fixed magnetic layer and the free magnetic layer comprises any one of iron (Fe), cobalt (Co), nickel (Ni), and an alloy of Fe, Co or Ni.

24. The magnetic memory structure of claim 21, wherein: the first oxide layer and the second oxide layer each comprise any one of magnesium oxide (MgO), magnesium zinc oxide (MgZnO), aluminum monoxide (AlOx) (thermally grown), iron oxide (Fe2O3), titanium oxide (TiO2), zinc oxide (ZnO), niobium oxide (Nb2O5), rhodium oxide (Rh2O3), tantalum oxide (Ta2O3), vanadium oxide (V2O5), aluminum oxide (Al2O3), and hafnium oxide (HfO2).

25. The magnetic memory structure of claim 21, wherein: the spacer layer comprises any one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi).

26. A method of storing data in a magnetic memory structure, comprising:

supplying a first input voltage of a polarity between a fixed magnetic layer and a free magnetic layer separated by a composite layer providing a quantum well to control a magnetization direction of the free magnetic layer to be parallel to a magnetization direction of the fixed magnetic layer; and supplying a second input voltage of the polarity between the fixed magnetic layer and the free magnetic layer to control the magnetization direction of the free magnetic layer to be antiparallel to the magnetization direction of the fixed magnetic layer.

* * * * *